(12) United States Patent
Inaoka

(10) Patent No.: US 7,951,764 B2
(45) Date of Patent: May 31, 2011

(54) NON-AQUEOUS, NON-CORROSIVE MICROELECTRONIC CLEANING COMPOSITIONS

(75) Inventor: Seiji Inaoka, Nazareth, PA (US)

(73) Assignee: Avantor Performance Materials, Inc., Phillipsburg, NJ (US)

( * ) Notice: Subject to any disclaimer, the term of this patent is extended or adjusted under 35 U.S.C. 154(b) by 532 days.

(21) Appl. No.: 11/720,084

(22) PCT Filed: Feb. 25, 2005

(86) PCT No.: PCT/US2005/006247
§ 371 (c)(1),
(2), (4) Date: May 24, 2007

(87) PCT Pub. No.: WO2006/062534
PCT Pub. Date: Jun. 15, 2006

(65) Prior Publication Data
US 2008/0103078 A1    May 1, 2008

Related U.S. Application Data

(60) Provisional application No. 60/634,141, filed on Dec. 8, 2004.

(51) Int. Cl.
*G03F 7/42* (2006.01)
*C11D 7/50* (2006.01)

(52) U.S. Cl. .................... 510/175; 510/176; 134/1.3

(58) Field of Classification Search .................. 510/175, 510/176; 134/1.3
See application file for complete search history.

(56) References Cited

U.S. PATENT DOCUMENTS

| | | | |
|---|---|---|---|
| 5,091,103 A | 2/1992 | Dean et al. | |
| 5,300,628 A | 4/1994 | Honda | |
| 5,308,745 A * | 5/1994 | Schwartzkopf | 430/329 |
| 5,561,105 A | 10/1996 | Honda | |
| 5,612,304 A | 3/1997 | Honda et al. | |
| 5,665,688 A * | 9/1997 | Honda et al. | 510/178 |
| 5,905,063 A | 5/1999 | Tanabe et al. | |
| 5,962,197 A | 10/1999 | Chen | |
| 6,140,027 A | 10/2000 | Baik et al. | |
| 6,440,326 B1 * | 8/2002 | Maruyama et al. | 252/79.1 |
| 6,465,403 B1 | 10/2002 | Skee | |
| 6,638,694 B2 | 10/2003 | Ikemoto et al. | |
| 6,774,097 B2 | 8/2004 | Yoon et al. | |
| 6,787,293 B2 | 9/2004 | Oowada et al. | |
| 6,916,772 B2 * | 7/2005 | Zhou et al. | 510/201 |
| 7,479,474 B2 * | 1/2009 | Cernat et al. | 510/175 |
| 2002/0037819 A1 | 3/2002 | Sahbari | |
| 2003/0130149 A1 * | 7/2003 | Zhou et al. | 510/176 |
| 2003/0186175 A1 | 10/2003 | Ikemoto et al. | |
| 2004/0147421 A1 * | 7/2004 | Charm et al. | 510/176 |
| 2004/0149309 A1 * | 8/2004 | Hsu | 134/3 |
| 2004/0185370 A1 * | 9/2004 | Baik et al. | 430/270.1 |
| 2004/0220065 A1 | 11/2004 | Hsu | |
| 2005/0032659 A1 * | 2/2005 | Shirota | 510/176 |
| 2007/0232513 A1 * | 10/2007 | Hsu | 510/175 |
| 2008/0287333 A1 * | 11/2008 | Inaoka | 510/176 |
| 2009/0156453 A1 * | 6/2009 | Inaoka | 510/176 |

FOREIGN PATENT DOCUMENTS

| | | |
|---|---|---|
| EP | 1347339 | 9/2003 |
| EP | 1519234 | 3/2005 |
| JP | 9152721 | 6/1997 |
| JP | 2000250230 | 9/2000 |
| WO | WO 99/60448 | 11/1999 |
| WO | WO 03/007085 | 1/2003 |
| WO | WO03006598 | 1/2003 |

* cited by examiner

*Primary Examiner* — Gregory E Webb
(74) *Attorney, Agent, or Firm* — Ohlandt, Greeley, Ruggiero & Perle, LLP; George W. Rauchfuss, Jr.

(57) ABSTRACT

Back end photoresist strippers and cleaning compositions of this invention are provided by amino acid-free, non-aqueous cleaning compositions that are essentially non-corrosive toward copper as well as aluminum and that comprise at least one polar organic solvent, at least one hydroxylated organic amine, and at least one corrosion inhibitor compound with multiple hydroxyl functional groups that is a compound of the formula:

$$T_1\text{-}[(CR_1R_2)_m\text{—}(CR_3R_4)_n]_p\text{—}(CR_5R_6)_q\text{-}T_2$$

where at least one of $R_1$ and $R_2$ OH and if one of $R_1$ and $R_2$ is not OH, it is selected from H, alkyl or alkoxy, m is a whole integer of 1 or greater, $R_3$ and $R_4$ are selected from H, alkyl or alkoxy, n is 0 or a greater whole positive integer, p is a whole integer of 1 or greater; at least one of $R_5$ and $R_6$ is OH and if one of $R_5$ and $R_6$ is not OH, it is selected from H, alkyl or alkoxy, q is a whole integer of 1 or greater; $T_1$ and $T_2$ are selected from H, alkyl, hydroxyalkyl, polyhydroxyalkyl, aminoalkyl, carbonylalkyl or amide groups or $T_1$ and $T_2$ may be connected forming a structure selected from an aliphatic cyclic or fused cyclic structure.

3 Claims, No Drawings

NON-AQUEOUS, NON-CORROSIVE MICROELECTRONIC CLEANING COMPOSITIONS

CROSS REFERENCE TO RELATED APPLICATIONS

This application is a national stage application of PCT/US2005/006247, filed Feb. 25, 2005, which claims the benefit of U.S. Provisional Application No. 60/634,141 filed Dec. 8, 2004.

FIELD OF THE INVENTION

This invention relates to methods and amino acid-free, non-aqueous, essentially non-corrosive, cleaning compositions for cleaning microelectronic substrates, and particularly to such cleaning compositions useful with and having improved compatibility with microelectronic substrates characterized by copper metallization as well as substrates characterized by aluminum metallization. The invention also relates to the use of such cleaning compositions for stripping photoresists, and cleaning residues from etch and plasma process generated organic, organometallic and inorganic compounds.

BACKGROUND TO THE INVENTION

Many photoresist strippers and residue removers have been proposed for use in the microelectronics field as downstream or back end of the manufacturing-line cleaners. In the manufacturing process a thin film of photoresist is deposited on a wafer substrate, and then circuit design is imaged on the thin film. Following baking, the unpolymerized resist is removed with a photoresist developer. The resulting image is then transferred to the underlying material, which is generally a dielectric or metal, by way of reactive plasma etch gases or chemical etchant solutions. The etch gases or chemical etchant solutions selectively attack the photoresist-unprotected area of the substrate.

Additionally, following the termination of the etching step, the resist mask must be removed from the protected area of the wafer so that the final finishing operation can take place. This can be accomplished in a plasma ashing step by the use of suitable plasma ashing gases or wet chemical strippers. Finding a suitable cleaning composition for removal of this resist mask material without adversely affecting, e.g., corroding, dissolving or dulling, the metal circuitry has also proven problematic.

As microelectronic fabrication integration levels have increased and patterned microelectonic device dimensions have decreased towards the size of atoms, the heat formed as current passes through the circuits has become a serious problem. It has become increasingly common in the art to employ copper metallizations as the conductor material, instead of aluminum, since copper is more beneficial in reducing the heat formation. These copper containing microelectronic materials have presented additional challenges to find acceptable cleaner compositions. Many process technology compositions that have been previously developed for "traditional" or "conventional" semiconductor devices containing $Al/SiO_2$ or $Al (Cu)/SiO_2$ structures cannot be employed with copper metallized structures. For example, hydroxylamine based stripper or residue remover compositions are successfully used for cleaning devices with Al metallizations, but are practically unsuitable for those with copper metallizations. Similarly, many stripper or residue remover compositions used for cleaning devices with copper metallizations are not suitable for Al metallized devices unless significant adjustments in the compositions are made.

Removal of these etch and/or ash residues following the plasma etch and/or ashing process for such copper and aluminum metallized microelectronic structures has proved problematic, particularly for substrates metallized with copper. Failure to completely remove or neutralize these residues can result in the absorption of moisture and the formation of undesirable materials that can cause corrosion to the metal structures. The circuitry materials are corroded by the undesirable materials and produce discontinuances in the circuitry wiring and undesirable increases in electrical resistance.

Heretofore, photoresist strippers have often contained amines since they generally show superior cleaning performance in attacking hardened photoresist and in the ability to strip such hardened photoresist from the surface of the microelectronic substrates. However, copper is generally also severely attacked by amines and significant metal corrosion can occur if such a conventional photoresist stripper is utilized without modification. Therefore, it is highly desirable to provide a copper compatible photoresist stripper or cleaner for use in the microelectronics industry, particularly for copper metallized materials. It is also highly desirable to provide a copper compatible photoresist stripper or cleaner for use in the microelectronics industry, particularly for copper metallized materials, that is also compatible for use with aluminum metallized materials. Since the same shift in technology from aluminum to copper metallization is being seen in the development of flat panel displays, it is also desirable to provide a stripper/cleaner that can be use in producing such flat panel displays.

BRIEF SUMMARY OF THE INVENTION

Back end photoresist strippers and cleaning compositions of this invention are provided by amino acid-free, non-aqueous, non-corrosive cleaning compositions that are essentially non-corrosive toward copper as well as aluminum and that comprise at least one polar organic solvent, at least one hydroxylated organic amine, and at least one corrosion inhibitor compound with multiple hydroxyl functional groups that is a compound of the formula:

$$T_1\text{-}[(CR_1R_2)_m\text{—}(CR_3R_4)_n]_p\text{—}(CR_5R_6)_q\text{-}T_2$$

where at least one of $R_1$ and $R_2$ is OH and if one of $R_1$ and $R_2$ is not OH, it is selected from H, alkyl or alkoxy, m is a whole integer of 1 or greater, $R_3$ and $R_4$ are selected from H, alkyl or alkoxy, n is 0 or a greater whole positive integer, p is a whole integer of 1 or greater; at least one of $R_5$ and $R_6$ is OH and if one of $R_5$ and $R_6$ is not OH, it is selected from H, alkyl or alkoxy, q is a whole integer of 1 or greater; $T_1$ and $T_2$ are selected from H, alkyl, hydroxyalkyl, polyhydroxyalkyl, aminoalkyl, carbonylalkyl or amide groups or $T_1$ and $T_2$ may be connected forming a structure selected from an aliphatic cyclic or fused cyclic structure. The compositions of this invention may also contain a number of other optional components. The cleaning compositions of this invention can be used over a wide range of process/operating conditions of pH and temperature, and can be used to effectively remove photoresists, post plasma etch/ash residues, sacrificial light absorbing materials and anti-reflective coatings (ARC). Additionally, it has been discovered that very difficult to clean samples, such as highly crosslinked or hardened photoresists and structures which contain titanium (such as titanium, titanium oxide and titanium nitride) or tantalums (such as tantalum, tantalum oxide and tantalum nitride) can be readily cleaned with the cleaning compositions of this invention.

The amino acid-free, non-aqueous, essentially non-corrosive microelectronic stripper/cleaner compositions of this invention will generally comprise from about 60% to about 90% of the organic polar solvent component, from about 1% to about 20% of the organic hydroxylated amine component, and a corrosion-inhibiting amount of the corrosion inhibitor compound(s) component with multiple hydroxyl functional groups that is a compound of the formula: $T_1\text{-}[(CR_1R_2)_m\text{---}(CR_3R_4)_n]_p\text{---}(CR_5R_6)_q\text{-}T_2$, generally from about 0.1% to about 15% of the corrosion inhibitor compound with multiple hydroxyl functional groups. The wt percentages provided in this specification are based on the total weight of the cleaning composition.

The amino acid-free, non-aqueous, essentially non-corrosive stripping/cleaning compositions of this invention can also optionally contain other compatible components, including but not limited to components such as chelating agents, organic hydroxyl-containing co-solvents, stabilizing and metal chelating or complexing agents, other metal corrosion inhibitors, and surfactants.

DETAILED DESCRIPTION OF INVENTION AND PREFERRED EMBODIMENTS

Back end photoresist strippers and cleaning compositions of this invention are provided by amino acid-free, non-aqueous compositions that are essentially non-corrosive toward copper as well as aluminum and that comprise one or more polar organic solvents, one or more organic hydroxylated amine, and one or more corrosion inhibitor compound with multiple hydroxyl functional groups that is a compound of the formula:

where at least one of $R_1$ and $R_2$ is OH and if one of $R_1$ and $R_2$ is not OH, it is selected from H, alkyl or alkoxy, m is a whole integer of 1 or greater, $R_3$ and $R_4$ are selected from H, alkyl or alkoxy, n is 0 or a greater whole positive integer, p is a whole integer of 1 or greater; at least one of $R_5$ and $R_6$ is OH and if one of $R_5$ and $R_6$ is not OH, it is selected from H, alkyl or alkoxy, q is a whole integer of 1 or greater; $T_1$ and $T_2$ are selected from H, alkyl, hydroxyalkyl, polyhydroxyalkyl, aminoalkyl, carbonylalkyl or amide groups or $T_1$ and $T_2$ may be connected forming a structure selected from an aliphatic cyclic or fused cyclic structure. By "non-aqueous" it is meant that the compositions are substantially free of water and will generally only have water present as impurities from the other components, and then will generally amount to no more than about 3% by weight of the composition.

The cleaning compositions of this invention can be used over a wide range of process/operating conditions of pH and temperature, and can be used to effectively remove photoresists, post plasma etch/ash residues, sacrificial light absorbing materials and anti-reflective coatings (ARC). Additionally, it has been discovered that very difficult to clean samples, such as highly crosslinked or hardened photoresists and structures which contain titanium (such as titanium, titanium oxide and titanium nitride) or tantalums (such as tantalum, tantalum oxide and tantalum nitride), can be readily cleaned with the cleaning compositions of this invention.

The amino acid-free, non-aqueous, essentially non-corrosive microelectronic stripper/cleaner compositions of this invention will generally comprise from about 60% to about 90%, preferably from about 75% to about 90%, and more preferably from about 80% to about 90%, of the organic polar solvent component; from about 1% to about 20%, preferably from about 3% to about 12%, and more preferably from about 5% to about 10%, of the organic hydroxylated amine component, and a corrosion-inhibiting amount of the corrosion inhibitor component, generally from about 0.1% to about 15%, preferably from about 1% to about 12%, and more preferably from about 3% to about 10%. The weight percentages provided in this specification are based on the total weight of the cleaning composition.

The compositions of this invention can contain one or more of any suitable organic polar solvent, preferably organic polar solvents that include amides, sulfones, sulfoxides, saturated alcohols and the like. Such organic polar solvents include, but are not limited to, organic polar solvents such as sulfolane (tetrahydrothiopene-1,1-dioxide), 3-methylsulfolane, n-propyl sulfone, dimethyl sulfoxide (DMSO), methyl sulfone, n-butyl sulfone, 3-methylsulfolane, amides such as 1-(2-hydroxyethyl)-2-pyrrolidone (HEP), dimethylpiperidone (DMPD), N-methyl-2-pyrrolidone (NMP), dimethylacetamide (DMAc), and dimethylformamide (DMF) and mixtures thereof. Especially preferred as the organic polar solvent are N-methylpyrrolidone, sulfolane, DMSO and mixtures of two or more of these three solvents.

The organic hydroxylated amine component may be one or more of any suitable hydroxylated amines, preferably hydroxylamine or an alkanolamine, preferably an alkanolamine. Suitable organic hydroxylated amine useful in the compositions of this invention include, but are not limited to hydroxylamine, monoethanolamine, diethanolamone, triethanolamine, and particularly 2-aminoethanol, 1-amino-2-propanol, 1-amino-3-propanol, 2-(2-aminoethoxy)ethanol, diethanolamine, 2-(2-aminoethylamino)ethanol, 2-(2-aminoethylamino)ethylamine and the like, and mixtures thereof. Most preferably the organic hydroxylated amine component is monoethanolamine, diethanolamine, triethanolamine, 2-(2-aminoethylamino)ethanol, and 1-amino-2-propanol and mixtures thereof.

The corrosion inhibiting compounds in the cleaning compositions of this invention are compounds of the formula:

where at least one of $R_1$ and $R_2$ are OH and if one of $R_1$ and $R_2$ is not OH, it is selected from H, alkyl or alkoxy, m is a whole integer of 1 or greater, $R_3$ and $R_4$ are selected from H, alkyl or alkoxy, n is 0 or a greater whole positive integer, p is a whole integer of 1 or greater; at least one of $R_5$ and $R_6$ are OH and if one of $R_5$ and $R_6$ is not OH, it is selected from H, alkyl or alkoxy, q is a whole integer of 1 or greater; $T_1$ and $T_2$ are selected from H, alkyl, hydroxyalkyl, polyhydroxyalkyl, aminoalkyl, carbonylalkyl or amide groups or $T_1$ and $T_2$ may be connected forming a structure selected from an aliphatic cyclic or fused cyclic structure. Preferably the alkyl, alkoxy, hydroxyalkyl, polyhydroxyalkyl, aminialkyl carbonylalkyl and amide groups are those having from about 1 to 6, more preferably from about 1 to 4, carbon atoms. Examples of suitable corrosion inhibitors include, but are not limited to: arabitol, erythritol, xylitol, mannitol, sorbitol, ethylene glycol, glycerol, 1,4-butane diol, 1,2-cyclopentanediol, 1,2-cyclohexanediol, and methylpentanediol.

The compositions of this invention may also optionally, and preferably does, contain one or more of any suitable organic hydroxyl-containing co-solvent. Any suitable organic hydroxyl-containing co-solvent may be employed in the compositions of this invention. Examples of such suitable organic hydroxyl-containing co-solvents include, but are not limited to, mono- and dialkyl ethers of diethylene glycol, known as Carbitol (2-(2-ethoxyethoxy)ethanol) and Carbitol derivatives, and saturated alcohols such as ethanol, propanol, butanol, hexanol, and hexafluoroisopropanol, and mixtures thereof. Especially preferred as a co-solvent is 2-(2-ethoxyethoxy)ethanol (Carbitol). A co-solvent may be present in the compositions of this invention in an amount, based on the total weight of the composition, of from 0 to about 30 wt %, preferably from about 0.1 to about 25 wt %, most preferably from about 0.5 to about 20 wt %, based on the weight of the composition.

The compositions of this invention may also contain one or more of any suitable other corrosion-inhibiting agents, preferably aryl compounds containing two or more OH, $OR_6$, and/or $SO_2R_6R_7$ groups bonded directly to the aromatic ring, where $R_6$, $R_7$ and $R_8$ are each independently alkyl, preferably alkyl of from 1 to 6 carbon atoms, or aryl, preferably aryl of from 6 to 14 carbon atoms. As examples of such preferred corrosion-inhibiting agents there may be mentioned catechol, pyrogallol, gallic acid, resorcinol and the like. Such other corrosion-inhibiting agents may be present in an amount of from 0 to about 15 wt %, preferably from about 0.1 to about 10 wt %, most preferably from about 0.5 to about 5 wt % based on the weight of the composition.

Organic or inorganic chelating or metal complexing agents are not required, but offer substantial benefits, such as for example, improved product stability. One or more of such inorganic chelating or metal complexing agents may be employed in the compositions of this invention. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties [e.g. ethylenediamine tetra(methylene phosphonic acid) (EDTMP), diethylenetriamine penta(methylene phosphonic acid), and triethylenetetramine hexa(methylene phosphonic acid), and mixtures thereof. The chelating agent will be present in the composition in an amount of from 0 to about 5 wt %, preferably from about 0.1 to about 2 wt %, based on the weight of the composition. Metal chelating or complexing agents of various phosphonates, such as ethylenediamine tetra(methylene phosphonic acid) (EDTMP) offer much improved stabilization of the cleaning compositions of this invention containing oxidizing agents at acidic and alkaline conditions and thus are generally preferred.

Optional: other different metal corrosion inhibitors, such as benzotriazole, may be employed in an amount of from 0 to about 5 wt %, preferably from about 0.1 to 2 wt %, based on the weight of the composition.

The cleaning compositions optionally may also contain one or more suitable surfactants, such as for example dimethyl hexynol (Surfynol-61), ethoxylated tetramethyl decynediol (Surfynol-465), polytetrafluoroethylene cetoxypropylbetaine (Zonyl FSK), Zonyl FSH and the like. The surfactant will generally be present in an amount of from 0 to about 5 wt %, preferably 0.1 to about 3 wt %, based on the weight of the composition.

Examples of cleaning compositions of this invention include, but are not limited to, the compositions set forth in the following Tables 1 and 2. In Tables 1 and 2 the abbreviations employed are as follows:

NMP=N-methyl pyrolidinone
SFL=sulfolane
DMSO=dimethyl sulfoxide
DEA=diethanolamine
MIPA=monoisopropanolamine
XYL=xylitol
D-MANN=D-mannitol
D-SORB=D-sorbitol
EG=ethylene glycol
GLY=glycerol
BUT=1,4-butanediol
MPD=methylpentanediol
CPD=trans 1,2-cyclopentanediol

TABLE 1

Compositions/Parts by Weight

| Components | 1 | 2 | 3 | 4 | 5 |
|---|---|---|---|---|---|
| NMP | 60 | 60 | 60 | 60 | 60 |
| SFL | 15 | 15 | 15 | 15 | 15 |
| DMSO | 15 | 15 | 15 | 15 | 15 |
| DEA | 5 | 5 | 5 | 5 | 5 |
| MIPA | | | | | |
| XYL | 5 | | | | |
| D-MANN | | 5 | | | |
| D-SORB | | | 5 | | |
| EG | | | | 5 | |
| GLY | | | | | 5 |
| BUT | | | | | |
| MPD | | | | | |
| CPD | | | | | |

TABLE 2

Compositions/Parts by Weight

| Components | 6 | 7 | 8 | 9 |
|---|---|---|---|---|
| NMP | 60 | 60 | 60 | 58 |
| SFL | 15 | 15 | 15 | |
| DMSO | 15 | 15 | 15 | 29 |
| DEA | 5 | 5 | 5 | 5 |
| MIPA | | | | 8 |
| XYL | | | | |
| D-MANN | | | | |
| D-SORB | | | | |
| EG | | | | |
| GLY | | | | |
| BUT | 5 | | | |
| MPD | | 5 | | |
| CPD | | | 5 | |

The anti-corrosion results obtained with the corrosion inhibiting compound-containing cleaning compositions of this invention were obtained in the following test for compositions of this-invention A piece of copper-coated silicon wafer (approximately 20×20 mm) was prepared for the experiment. The piece was cleaned in a buffered oxide etch (which contains 35 w/w % $NH_4F$ and 6 w/w % HF for 1 minute, followed by rinsing in deionized water for 1 minute, and dried in nitrogen spray. Then the wafer piece was immersed in a 150 mL beaker that has 100 g of test solution in it, and the solution was heated at 60° C., stirred with a magnetic stirrer at 200 rpm and, 60 minutes later, the piece was removed from the test solution, rinsed with deionized water for 1 minute, and dried with nitrogen spray. The thickness of copper layer (before and after the experiment) was determined by the ResMap (manufactured by Creative Design Engineering, Sunnyvale, Calif.) 4-point probe system.

The test solutions (cleaning compositions) were the Invention Compositions 1 to 8 of Tables 1 and 2. The results of these etch rate and photoresist stripping tests for the compositions were as set forth in Table 3.

TABLE 3

| Composition No. | Cu Etch Rate (Å/min.) |
| --- | --- |
| 1 | 0 |
| 2 | 0.4 |
| 3 | 0.3 |
| 4 | 0.5 |
| 5 | 0.6 |
| 6 | 0.6 |
| 7 | 0.2 |
| 8 | 3.0 |

For the photoresist stripping, the same test compositions of this invention are used at the same temperature (60° C.) with the same stirring rate (200 rpm). A piece of glass having a positive photoresist layer (ca. 1000 angstroms) deposited thereon is immersed in the test solution to determine that photoresist is removed by the compositions of the invention.

In addition to the cleaning compositions of this invention being essentially non-corrosive to copper metallized microelctronic substrates and capable of cleaning photoresist, plasma and etch residues from such substrates, such compositions are also able to similarly clean aluminum metallized microelectonic substrates in a similar non-corrosive manner.

Examples of preferred compositions of this invention that also contain an organic hydroxyl-containing co-solvent include, but are not limited to, the illustrative compositions set forth in Table 4. In Table 4 the abbreviations employed are the same as those employed in Tables 1 and 2 and, additionally, CAR=carbitol, namely (2-(2-ethoxyethoxy)ethanol.

TABLE 4

| Compositions/Parts by Weight | | | | |
| --- | --- | --- | --- | --- |
| Components | 10 | 11 | 12 | 13 |
| NMP | 58 | 29 | 29 | 58 |
| DMSO | 29 | 29 | | |
| MIPA | 8 | 8 | 8 | 8 |
| D-SORB | 5 | 5 | 5 | 5 |
| CAR | | 29 | 29 | 58 |

The inhibition of aluminum corrosion with these Compositions 10 to 13 is illustrated by the following tests. In a first corrosion test, glass substrates having a MO/Al/Mo triple-layer pattern on which a photoresist has been coated on the metal was immersed for five minutes in the hot (70° C.) compositions stirred at 200 rpm, then rinsed with deionized water for 1 minute, nitrogen dried and the surface evaluated using a surface electron microscope (SEM). In a second corrosion test surfaces of the same type as in the first test were also immersed for five minutes in the hot (70° C.) compositions stirred at 200 rpm Then these substrates were transferred to aqueous solutions comprising 5 parts by weight of the composition and 95 parts distilled water for five minutes, unstirred at room temperature. The substrate was then washed with deionized water, and the surface evaluated using surface electron microscope (SEM). The objective of this set of experiment was to simulate "the worst condition" where, in the real commercial process, stripper solution on the metal surface gradually is replaced with rinsing water. A 5% solution/95% water mixture is considered as the most extreme case. Therefore, corrosion protection is considered sufficient if the formulation "passes" this test.

The cleaning capability of these Compositions 10 to 13 was evaluated in the following photoresist cleaning tests. Glass substrate with metal surface (multiple layer Mo/Al type) with photoresist was employed. The substrate surface was placed in a Composition formulation at room temperature, stirred at 200 rpm. Then the substrate surface was taken out from the formulation and rinsed with deionized water. Optical microscope (magnification in the range of 1000×) was used to evaluate the amount of "residue" on the surface.

The results of the corrosion tests and the cleaning test for Compositions 10 to 13 were as follows.

Composition 10: Corrosion tests—no noticeable Galvanic corrosion found after in either test treatment;
Cleaning test—cleaned at less than 2 minutes.

Composition 11: Corrosion tests—no noticeable Galvanic corrosion found in first corrosion test; slight Galvanic corrosion in the still acceptable range after second corrosion test
Cleaning test—cleaned at less than 2 minutes.

Composition 12: Corrosion tests—no noticeable Galvanic corrosion found in first corrosion test; Al layer etched away by Galvanic corrosion after aqueous solution treatment
Cleaning test—cleaned at less than 2 minutes.

Composition 13: Corrosion tests—no noticeable Galvanic corrosion found in first corrosion test; Al layer moderately etched away by Galvanic corrosion; still acceptable after aqueous solution treatment.
Cleaning test—cleaned at less than 2 minutes.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

I claim:

1. An amino acid-free, non-aqueous cleaning composition for cleaning photoresist and residues from microelectronic substrates, the composition consisting of N-methyl pyrrolidone, dimethyl sulfoxide, monoisopropanolamine and D-sorbitol and wherein the N-methyl pyrrolidone and dimethyl sulfoxide components together consist of from about 60% to about 90% by weight of the composition, the monoisopropanolamine component consists of from about 3% to about 12% by weight of the composition and the D-sorbitol component consists of from about 1% to about 12% by weight of the composition.

2. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 1.

3. A process according to claim 2 wherein the microelectronic substrate to be cleaned is characterized by the presence of copper metallization.

* * * * *